(12) United States Patent
Yudovsky et al.

(10) Patent No.: US 6,767,176 B2
(45) Date of Patent: Jul. 27, 2004

(54) LIFT PIN ACTUATING MECHANISM FOR SEMICONDUCTOR PROCESSING CHAMBER

(75) Inventors: Joseph Yudovsky, Campbell, CA (US); Salvador P. Umotoy, Antioch, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/895,441

(22) Filed: Jun. 29, 2001

(65) Prior Publication Data

US 2003/0000775 A1 Jan. 2, 2003

(51) Int. Cl.$^7$ .............................................. B66F 11/00
(52) U.S. Cl. .................. 414/672; 414/652; 414/935
(58) Field of Search ................ 414/610, 652, 414/654, 655, 656, 672, 935

(56) References Cited

U.S. PATENT DOCUMENTS

| | | | |
|---|---|---|---|
| 4,859,137 A | * 8/1989 | Bonora et al. | 414/648 |
| 4,861,222 A | * 8/1989 | Mirkovich | 414/648 |
| 5,100,502 A | 3/1992 | Murdoch et al. | 156/643 |
| 5,879,128 A | 3/1999 | Tietz et al. | 414/757 |
| 5,899,653 A | * 5/1999 | Brodine | 414/222.04 |
| 5,989,342 A | * 11/1999 | Ikeda et al. | 118/52 |
| 6,102,164 A | 8/2000 | McClintock et al. | 187/267 |
| 6,151,446 A | * 11/2000 | Hunter et al. | 392/416 |
| 6,190,113 B1 | * 2/2001 | Bui et al. | 414/672 |
| 6,309,163 B1 | * 10/2001 | Nering | 414/331.01 |
| 6,485,248 B1 | * 11/2002 | Taylor, Jr. | 414/672 |

FOREIGN PATENT DOCUMENTS

EP 0 821 404 A2 1/1998

* cited by examiner

Primary Examiner—James W. Keenan
(74) Attorney, Agent, or Firm—Dugan & Dugan LLP

(57) ABSTRACT

A set of lift pins defines a storage location for a substrate in a substrate processing chamber. Each lift pin has an actuating mechanism including a translating mechanism that translates vertical actuation into horizontal motion. The actuating mechanism may include a base, a mechanism adapted to raise and lower the base, and a lever pivotally mounted on the base. The lift pin may be fixedly mounted on the lever. A stop may be adjacent the base and adapted to engage the lever to pivot the lever as the base is lowered.

9 Claims, 5 Drawing Sheets

LIFT PIN ACTUATING MECHANISM FOR SEMICONDUCTOR PROCESSING CHAMBER

FIELD OF THE INVENTION

The present invention relates to semiconductor manufacturing of thin substrates or wafers and, more particularly, to the transfer and loading of semiconductor wafers, glass plates and the like into and out of processing chambers.

BACKGROUND OF THE INVENTION

Semiconductor manufacturing generally requires that a number of different processes be applied to a substrate such as a wafer. Typically, each process is applied to a wafer in a different chamber dedicated to a respective process. Thus the manufacturing process involves not only a sequence of processes carried out in the respective chambers, but also transporting wafers among the processing chambers, and loading and unloading wafers into and out of the processing chambers. Most semiconductor processing is carried out in chambers configured to process one wafer at a time, in a very high vacuum capable environment. Thus, a process to be performed in a particular chamber cannot be carried out while wafers are being loaded into or removed from the processing chamber. Consequently, reducing the time required to load and unload wafers into and out of processing chambers is a significant factor in maximizing manufacturing throughput.

It is therefore desirable to provide for rapid and reliable transfer of wafers to and from processing chambers. It is also desirable that chamber components which aid in the transfer of wafers be simple and inexpensive to manufacture.

SUMMARY OF THE INVENTION

According to a first aspect of the invention, a lift pin/actuating assembly includes a lift pin and an actuating mechanism having an actuator configured to generate movement by the lift pin along a first axis, and a translation mechanism coupled to the actuator and configured to translate movement of the actuator along the first axis into movement by the lift pin along a second axis.

According to a second aspect of the invention, a method of operating a substrate lift pin includes applying vertical actuation to the pin, moving the pin vertically a first distance, contacting a vertical motion stop after moving the first distance, and translating further vertical actuation into horizontal movement of the pin.

According to a third aspect of the invention, a lift pin/actuating assembly for a semiconductor processing chamber includes a lift pin adapted to hold a semiconductor substrate in the processing chamber. Also included in the lift pin/actuating assembly are a base on which the lift pin is mounted, a first mechanism adapted to raise and lower the base, and a second mechanism adapted to convert vertical motion of the base into pivoting motion of the lift pin.

According to a fourth aspect of the invention, a method of operating a semiconductor processing chamber includes providing a lift pin, mounting the lift pin so that it extends upwardly into the processing chamber, lowering a base on which the lift pin is mounted, and converting the lowering motion of the base into pivoting motion of the lift pin.

Other objects, features and advantages of the present invention will become more fully apparent from the following detailed description of the preferred embodiments, the appended claims and the accompanying drawings.

DETAILED DESCRIPTION OF PREFERRED EMBODIMENTS

An embodiment of the invention includes a lift pin/actuating assembly that employs a single actuator and a translation mechanism configured to translate actuation along a first axis into movement along a second axis ("movement along an axis" should be understood to include linear motion in the direction of the axis, or pivotal motion about the axis.) The actuating assembly is configured to allow actuation along the first axis to result in a predetermined range of lift pin movement along the first axis. Beyond the predetermined range of lift pin movement, further actuation along the first axis is translated into movement along the second axis. The translation mechanism may include a motion stop which defines the predetermined range of lift pin movement and a motion translator (e.g., a lever or an appropriately configured link such as a four bar link, etc.).

An aspect of the invention that employs a vertical motion actuator, a vertical motion stop, and a lever configured to translate vertical linear motion into horizontal pivoting motion is shown and described with reference to FIGS. 1–3(l).

Figure 1:
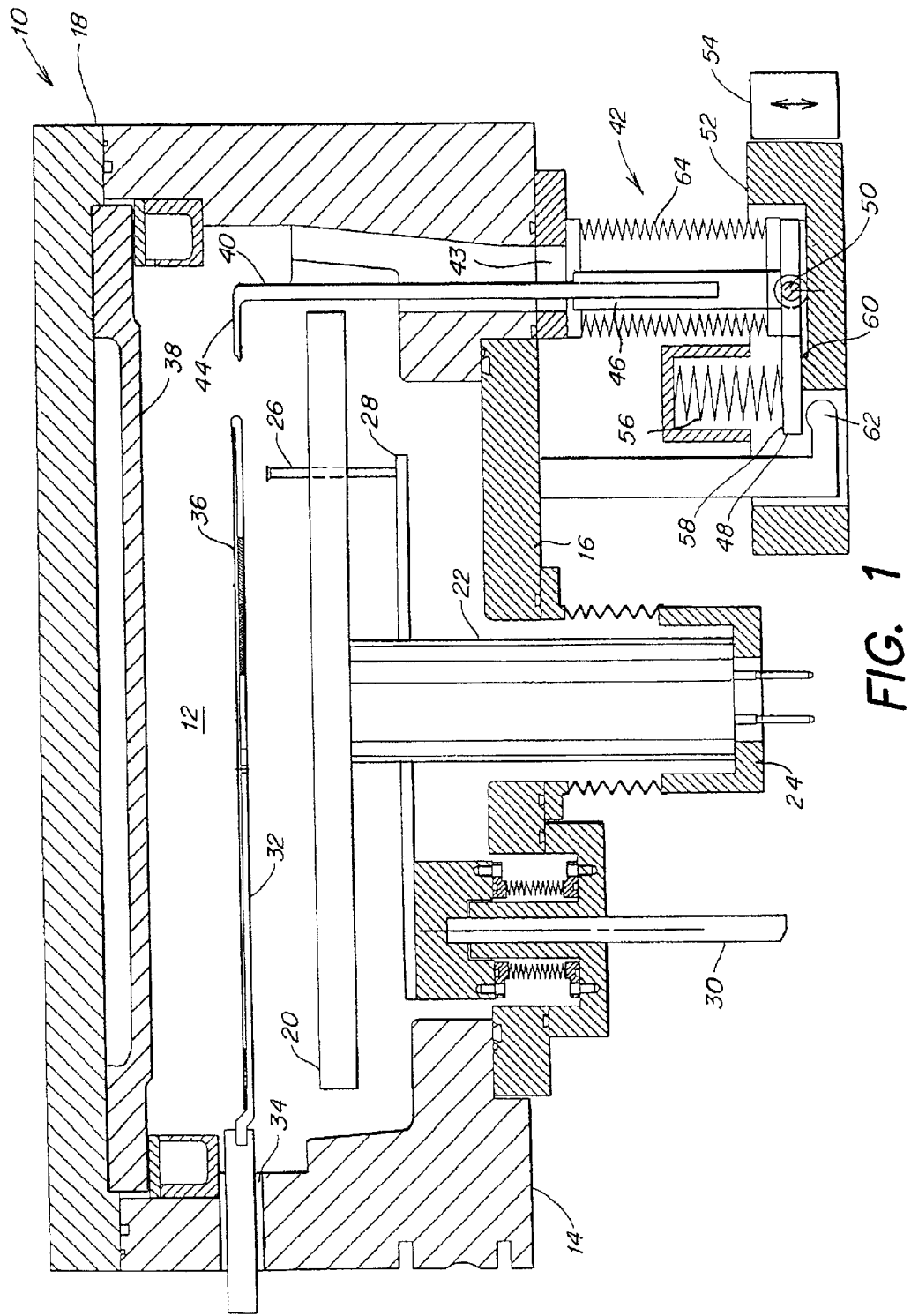
FIG. 1 is a somewhat schematic cross-sectional view of a processing chamber provided in accordance with an aspect of the invention, showing a lift pin in storage position.

FIG. 1 is a schematic cross-sectional view of a semiconductor processing chamber 10 provided in accordance with an aspect of the invention. The processing chamber 10 includes an enclosure 12 defined by side wall 14, chamber floor 16 and chamber top 18.

A heated pedestal 20 is mounted in the processing chamber 10 on a shaft 22. A lift mechanism 24 is associated with the shaft 22 to selectively raise and lower the pedestal 20. The pedestal 20 is provided to support a wafer in the chamber 10 during processing.

Conventional lift pins (of which only one pin 26 is shown) are provided to selectively lift a wafer from the pedestal 20 or to deposit a wafer on pedestal 20. The lift pins are raised and lowered via a lift plate 28 and a lift mechanism 30.

Reference numeral 32 represents a robot blade that has entered the processing chamber 10 via a slit valve 34 while carrying a wafer 36. A so-called "showerhead" 38 is suspended from the chamber top 18 and allows process gas to flow toward the pedestal 20 during processing.

In accordance with an aspect of the invention, a plurality of lift pins, and associated actuating mechanisms, are provided to define a wafer storage position within the enclosure 12. For clarity, only one lift pin 40 and its associated actuating mechanism 42 are shown. Note in the exemplary embodiment shown, the actuating mechanism 42 is positioned below the floor 16 of the processing chamber 10, and the lift pin 40 extends into the enclosure 12 via an opening 43 in the floor 16. The lift pin 40 has a horizontally extending upper section 44, on which a wafer is supported during storage. The lift pin 40 may be mounted directly to a lever 48 or may be held in a holder 46 which in turn is mounted on the lever 48. The lift pin 40 may be fixedly coupled to the lever 48 such that the angle therebetween remains fixed. The lever 48 is mounted by means of a pivot 50 on a moveable base 52. A lift mechanism or actuator 54 is associated with the base 52 to selectively raise and lower the base 52.

A spring 56 is connected between the base 52 and a free end 58 of the lever 48. The spring 56 biases the free end 58 of the lever 48 in a downward direction (counter-clockwise about the pivot 50 in FIG. 1). A step 60 on the base 52 defines a horizontal position of the lever 48 by limiting the downward motion of the lever 48 relative to the base 52. A stop 62 is suspended from the chamber floor 16 and is positioned under the free end 58 of the lever 48. A bellows 64 accommodates translational and angular motion of the lift pin 40 and its holder 46 while preventing particles from the external environment from entering the enclosure 12 via the opening 43.

Those who are skilled in the art will appreciate that a controller (not shown) is associated with processing chamber 10 to control operation of lift mechanisms 24, 30, 54, slit valve 34, and other components of processing chamber 10 which are not shown.

The inventive lift pin/actuating assembly is shown in its storage position in FIG. 1. Because of the relative positioning of the base 52 and the stop 62, stop 62 does not come into play when the base is positioned as shown in FIG. 1, and the position of the lever 48, as biased downwardly by the spring 56, is determined by the step 60 of the base 52. Lever 48 is in substantially a horizontal orientation, and lift pin 40 is in substantially a vertical orientation with the upper section 44 of lift pin 40 obstructing a path of travel of pedestal 20.

Figure 2:
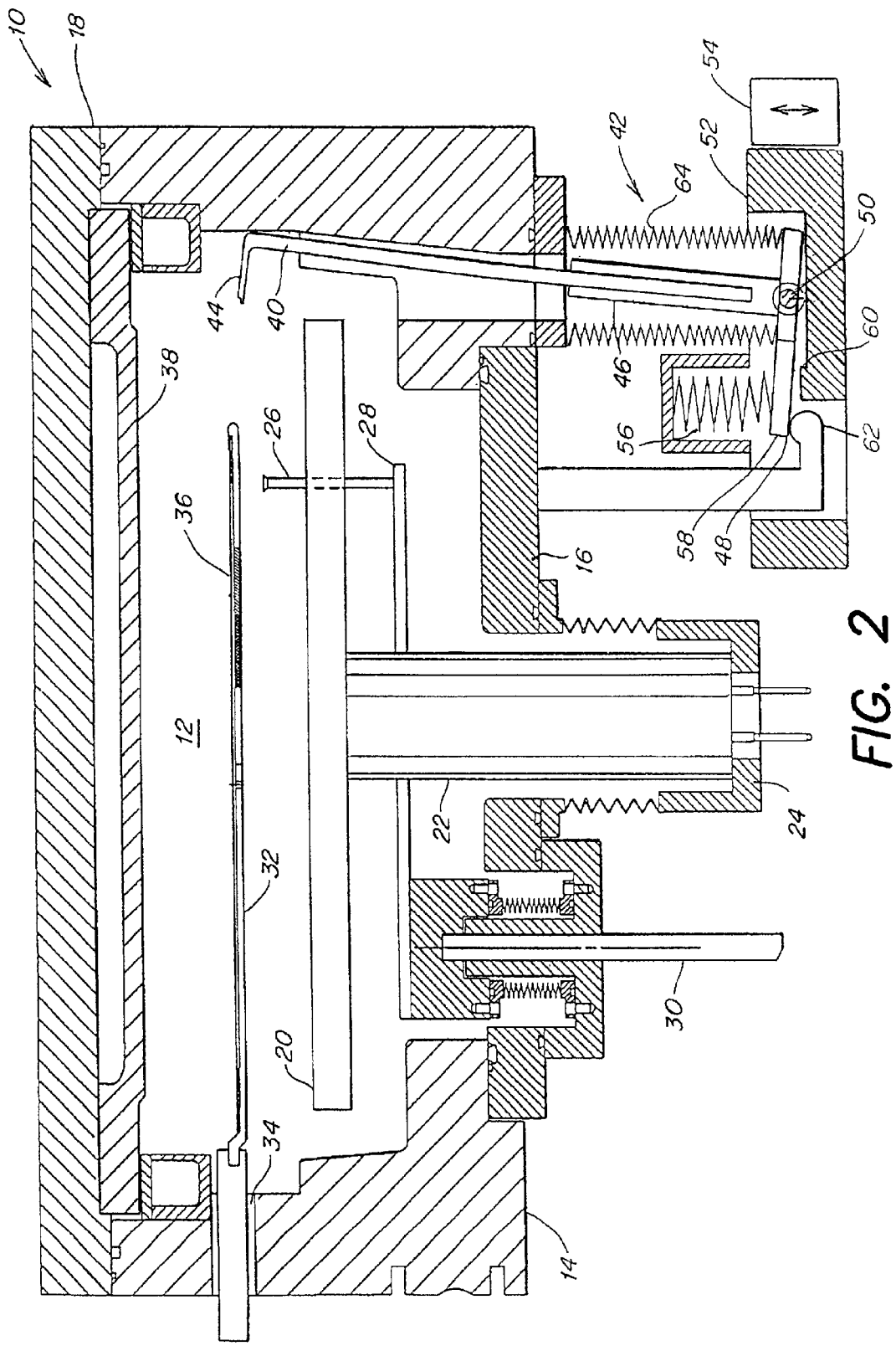
FIG. 2 is a view similar to FIG. 1, showing the lift pin in a retracted position.

Lift pin 40 is shown in its retracted position in FIG. 2. To move the lift pin 40 from its storage position (FIG. 1) to its retracted position (FIG. 2) the base 52 is moved downwardly from the position shown in FIG. 1. The movement of base 52 in the downward direction is actuated by lifting mechanism 54. As the base 52 is moved downwardly, the stop 62 comes in contact with the free end 58 of the lever 48, pushing the free end 58 of the lever 48 upwardly relative to the base 52, against the biasing force of the spring 56. The lever 48, in response to contact with stop 62, thus pivots on pivot 50, causing holder 46 and lift pin 40 to be inclined or tilted from the vertical, thereby bringing lift pin 40 to its retracted position shown in FIG. 2. In its retracted position lift pin 40 does not obstruct the path of travel of pedestal 20.

It will be recognized from FIGS. 1 and 2 that base 52 may be considered to have two ranges of movement. In a first range of movement at and above its position in FIG. 1, movement of base 52 raises or lowers lift pin 40 without pivoting lift pin 40 (as the lever 58 does not contact the stop 62). In a second range of movement between its respective positions in FIGS. 1 and 2, movement of base 52 results in pivoting of lift pin 40 (as the lever 58 contacts the stop 62 and pivots in response to contact therewith).

With the lift pin actuating mechanism 42 shown in FIGS. 1 and 2, a single lift mechanism or actuator 54 is employed both to translate the lift pin 40 in a vertical direction and to impart angular motion to the lift pin 40 (by means of the interaction between the lever 48 and the stop 62). That is, the single lift mechanism 54 both raises and lowers lift pin 40 and pivots lift pin 40 between the storage position and the retracted position. Consequently, the inventive actuating mechanism 42 provides a relatively simple and cost effective arrangement for both raising and pivoting the lift pin 40.

FIGS. 3(a)–3(l) illustrate steps performed during an exemplary wafer exchange operation with respect to the processing chamber 10.

Figure 3A:
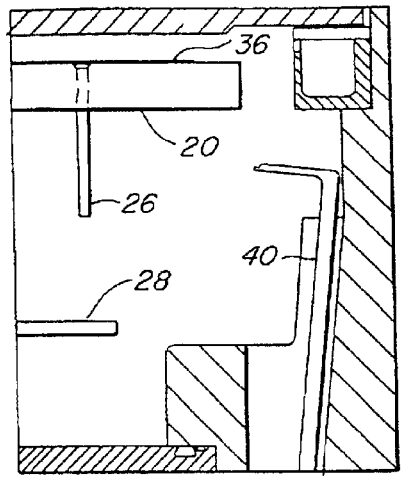
FIGS. 3(a)–3(l) are partial cross-sectional views of the processing chamber of FIGS. 1 and 2, showing an exemplary sequence of steps for a substrate exchange procedure.

FIG. 3(a) shows a condition that is in effect at a time when processing of wafer 36 is complete. It will be observed that wafer 36 is supported on the pedestal 20 in a processing position near the top of the processing chamber. The lift pin 40 is in its retracted (non-storage) position so that it does not obstruct the path of travel of the pedestal 20.

Figure 3B:
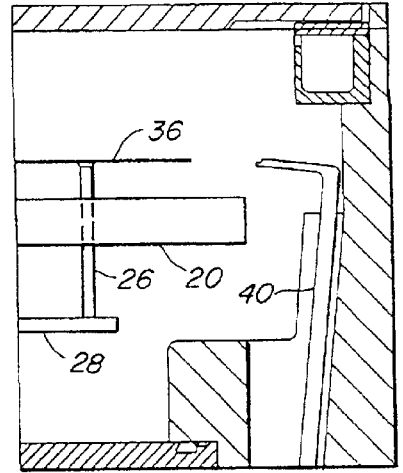

After the condition of FIG. 3(a), the pedestal 20 is lowered and the lift pin 26 lifts the wafer 36 from the pedestal 20, to produce the position shown in FIG. 3(b). The pedestal 20 is now in a loading position.

Figure 3C:
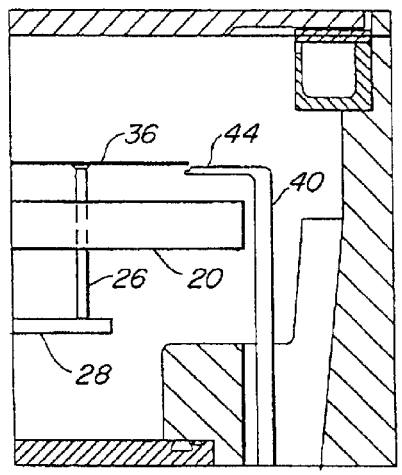

Next, the lift pin 40 is actuated, i.e. moved from its retracted position (FIG. 3(b), FIG. 2) to its storage position (FIG. 3(c), FIG. 1). The lift pin 40 is no longer inclined, but rather is upright or vertical and hence positioned to support the wafer 36 on the upper section 44 of the lift pin 40. From the foregoing discussion of FIGS. 1 and 2, it will be recognized that the pivoting of the lift pin 40 from its retracted position to its storage position is accomplished by raising the base 52 so as to free the lever 48 from contact with the stop 62, thereby leaving lever 48 free to pivot downwardly in response to the biasing force of spring 56.

Figure 3D:
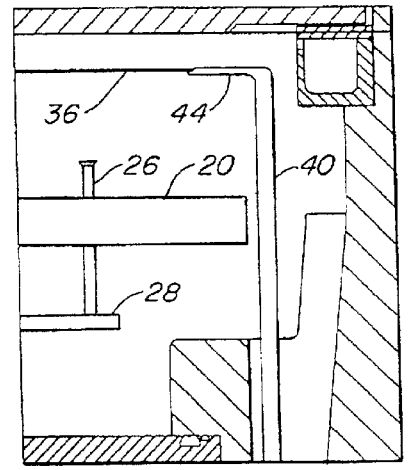

Next, the lift pin 40 is raised (by further raising the base 52) so that the lift pin 40 lifts the wafer 36 from the lift pin 26. The resulting position is shown in FIG. 3(d). In the condition shown in FIG. 3(d) the wafer 36 is held in a storage position by the upper section 44 of the lift pin 40.

Figure 3E:
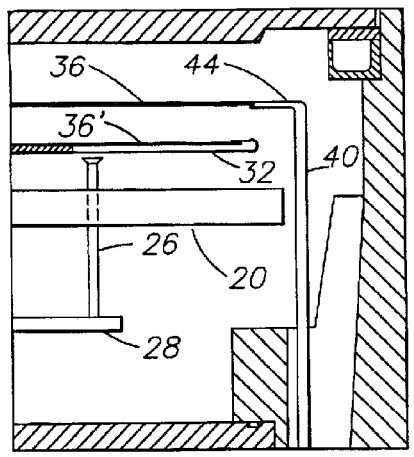
Figure 3F:
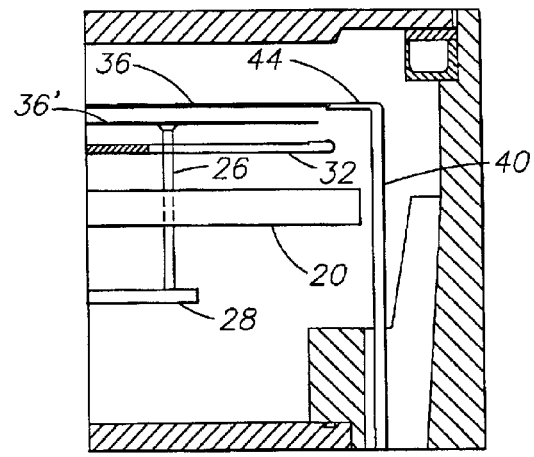
Figure 3G:
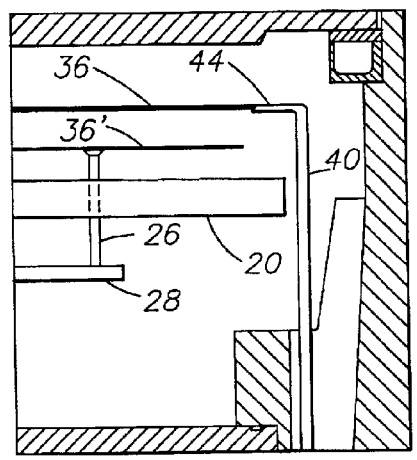

At the next step, robot blade 32 enters the chamber 10 carrying a new wafer 36' which is to be processed in the chamber. The resulting condition is shown in FIG. 3(e). The lift pin 26 is then raised to lift the wafer 36' from the robot blade 32 (FIG. 3(f)). The robot blade 32 then retracts from the processing chamber 10, to result in the condition shown in FIG. 3(g).

Figure 3H:
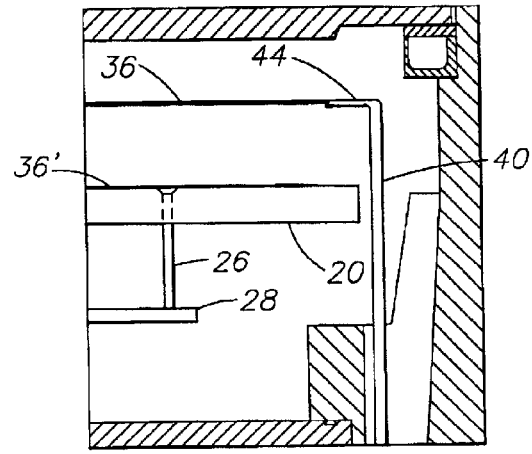
Figure 3I:
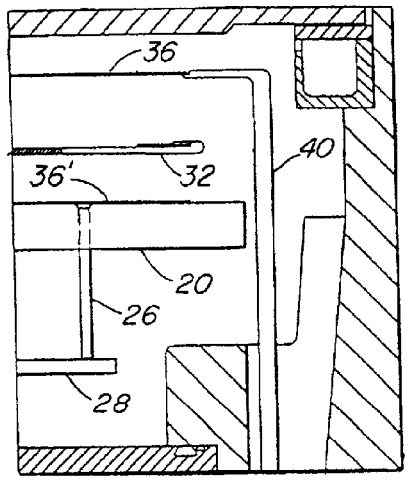
Figure 3J:
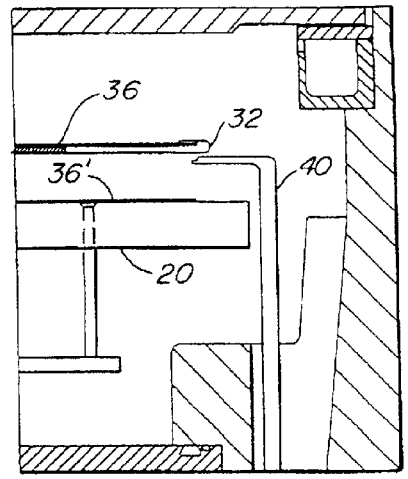
Figure 3K:
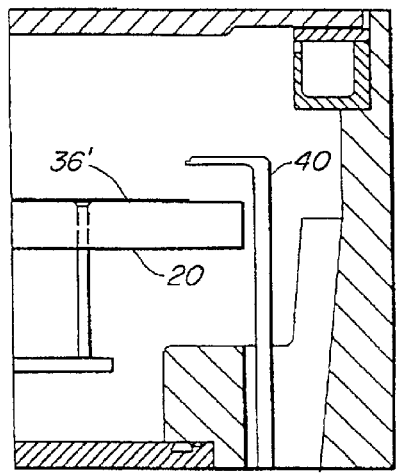
Figure 3L:
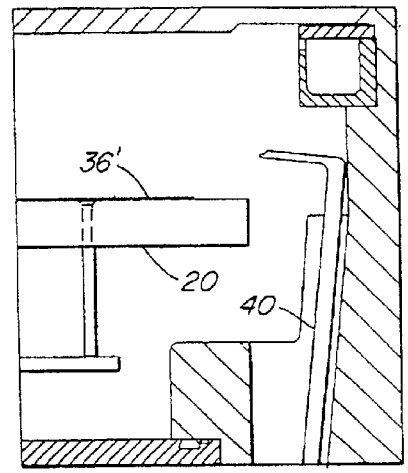

At the next step of the exchange operation, lift pin 26 is lowered to place the new wafer 36' on the pedestal 20, as shown in FIG. 3(h). The robot blade 32 then reenters the processing chamber 10, this time without a wafer being carried on the robot blade 32. The resulting condition is shown in FIG. 3(i). Lift pin 40, which supports the processed wafer 36, is then lowered (by lowering the base 52) to place the wafer 36 on the robot blade 32 (FIG. 3(j)). The robot blade 32 is then retracted from the processing chamber 10, carrying the processed wafer 36 out of the chamber 10. The exchange of wafers is now complete, resulting in the condition shown in FIG. 3(k). Lift pin 40 is then moved from its storage position to its retracted position (FIG. 3(l)), by further lowering the base 52 to cause stop 62 to contact and pivot lever 48 (and the lift pin 40 fixedly coupled thereto), so that the path of travel of the pedestal 20 is no longer obstructed by the lift pin 40. Accordingly, the pedestal 20 supporting the wafer 36' may be raised to the processing position, which was initially shown in FIG. 3(a).

The foregoing description discloses only a preferred embodiment of the invention; modifications of the above disclosed apparatus and method which fall within the scope of the invention will be readily apparent to those of ordinary skill in the art. For example, the invention has been illustrated in the context of a chemical vapor deposition (CVD) chamber. The invention may also be applied in a physical vapor deposition (PVD) chamber, an etching chamber, a photolithography chamber, a loadlock chamber, a degassing chamber, a heating chamber, a cooling chamber or at any location where substrates are exchanged. The invention may also be employed in connection with substrates other than semiconductor wafers (e.g., glass plates and the like).

It will be understood that the embodiment shown in FIGS. 1–3(l) is merely exemplary and that the configuration of the lift pin/actuating assembly may vary and still function in accordance with the invention. For instance, a horizontal actuator may move the lift pin to the retracted position, contact a motion stop and translate further horizontal actuation into vertical motion. Further the specific operation of the assembly may change and still function in accordance with the invention. For example, the position of the stop and the motion translator may be reversed such that the motion translator is raised to contact the stop, rather than lowered to contact the stop, etc.

Accordingly, while the present invention has been disclosed in connection with the preferred embodiments thereof, it should be understood that other embodiments may fall within the spirit and scope of the invention, as defined by the following claims.

What is claimed is:

1. A lift pin/actuating assembly, comprising:
   a lift pin; and
   an actuating mechanism having an actuator configured to generate movement of the lift pin along a first axis, and a translation mechanism coupled to the actuator and configured to translate movement of the actuator along the first axis into movement of the lift pin along a second axis;
   wherein the translation mechanism comprises a motion stop configured to stop movement of the lift pin along the first axis at a predetermined point, and a motion translator configured to translate actuation of the lift pin along the first axis into movement of the lift pin along the second axis, after the predetermined point is reached.

2. The assembly of claim 1, wherein the motion translator comprises a lever.

3. A lift pin/actuating assembly, comprising:
   a lift pin; and
   an actuating mechanism having an actuator configured to generate movement of the lift pin along a first axis, and a translation mechanism coupled to the actuator and configured to translate movement of the actuator along the first axis into movement of the lift pin along a second axis;
   wherein the movement of the lift pin along the first axis is a vertical movement, and the movement of the lift pin along the second axis is a horizontally pivoting movement about the second axis; and
   wherein the translation mechanism comprises a motion stop configured to stop movement of the lift pin along the first axis at a predetermined point, and a motion translator configured to translate actuation of the lift pin along the first axis into movement of the lift pin along the second axis, after the predetermined point is reached.

4. The assembly of claim 3, wherein the motion translator comprises a lever.

5. A lift pin/actuating assembly for a substrate processing chamber, comprising:
   a base;
   a mechanism adapted to raise and lower the base;
   a lever pivotally mounted on the base;
   a lift pin adapted to hold a substrate in the processing chamber, the lift pin mounted on the lever; and
   a stop adjacent the base and adapted to engage the lever to pivot the lever as the base moves vertically;
   wherein a pedestal is mounted for vertical movement in the processing chamber, the lift pin is moveable to pivot between a first position in which the lift pin obstructs a path of movement of the pedestal and a second position in which the lift pin does not obstruct the path of movement of the pedestal;
   wherein the assembly further comprises a spring adapted to bias the lift pin toward the first position; and
   wherein the base includes a step against which the spring biases the lever when the lever is not engaged by the stop.

6. The assembly of claim 5, wherein the spring biases the lever in a downward direction, and the stop engages the lever from below as the base is lowered.

7. A lift pin/actuating assembly for a semiconductor processing chamber, comprising:
   a lift pin adapted to hold a substrate in the processing chamber; and
   a movement mechanism on which the lift pin is mounted, the movement mechanism having a first range of movement in which lowering of the movement mechanism causes the lift pin to be lowered without pivoting and having a second range of movement in which lowering of the movement mechanism causes the lift pin to pivot;
   wherein the movement mechanism comprises a motion stop configured to stop movement of the lift pin along the first axis at a predetermined point, and a motion translator configured to translate actuation of the lift pin along the first axis into movement of the lift pin along the second axis, after the predetermined point is reached.

8. The assembly of claim 7, wherein the first range of movement of the movement mechanism is above the second range of movement of the movement mechanism.

9. The assembly of claim 7, wherein the movement mechanism pivots the lift pin between a storage position in which the lift pin is positioned to hold the substrate and a retracted position in which the lift pin is not positioned to hold the substrate.

* * * * *